United States Patent [19]

Gray et al.

[11] 4,268,849
[45] May 19, 1981

[54] RAISED BONDING PAD

[75] Inventors: Bruce Gray, Southbury, Conn.; James M. Harris, Palo Alto; William M. Gouin, San Jose, both of Calif.

[73] Assignee: National Semiconductor Corporation, Santa Clara, Calif.

[21] Appl. No.: 957,645

[22] Filed: Nov. 3, 1978

[51] Int. Cl.³ .......................................... H01L 23/48
[52] U.S. Cl. ...................... 357/71; 357/51; 357/61
[58] Field of Search .............................. 357/51, 61, 71

[56] References Cited

U.S. PATENT DOCUMENTS 4,164,607 8/1979 Thiel et al. ............................ 357/71

Primary Examiner—Edward J. Wojciechowicz
Attorney, Agent, or Firm—Brown & Martin

[57] ABSTRACT

A bonding pad structure for an LED includes a first layer of nickel-chromium in contact with the contact face of a gallium arsenide wafer with further layers of either gold, palladium, or both, with palladium being the top layer of the first pad structure laid down by vaporization with a raised structure overlying the first structure by means of plating and including layers of nickel, gold and/or other conducting metal.

13 Claims, 5 Drawing Figures

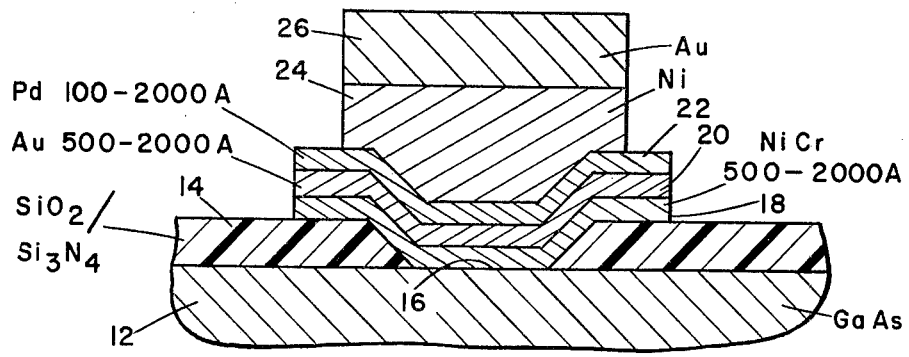
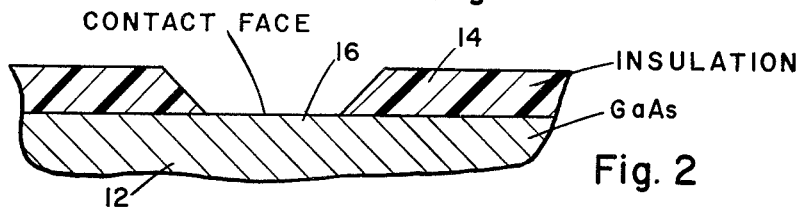
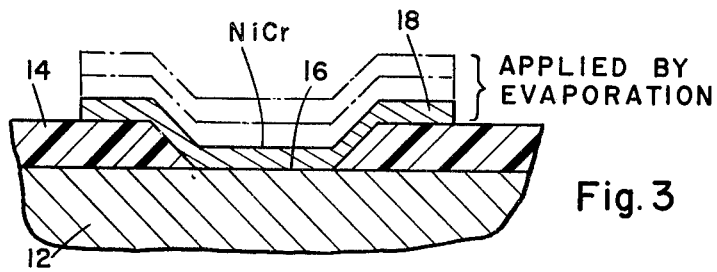
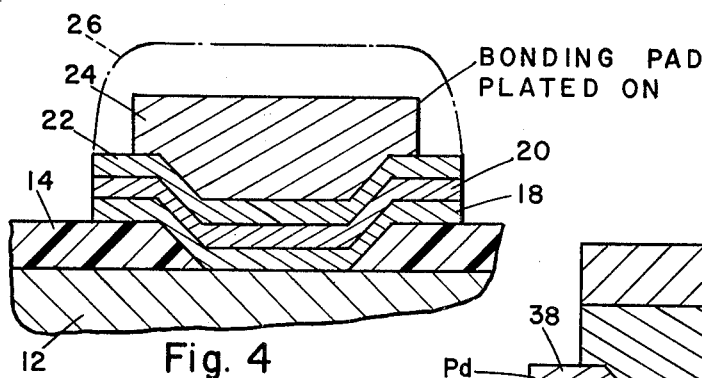
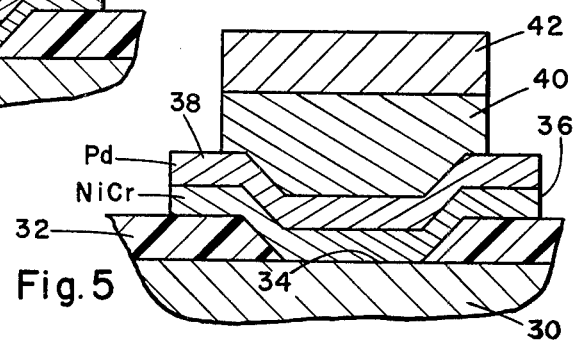

RAISED BONDING PAD

BACKGROUND OF THE INVENTION

The present invention relates to bonding pad structures and methods of making same, and pertains particularly to a raised bonding pad structure for III-V compounds.

Many semiconductor devices are connected into electronic circuits by means of conductors connected by bonding pads or the like. Bonding pads and leads must be carefully constructed and selected to match the characteristics of the elements being placed in the circuit. The connection of metallic leads to class III-V compounds ia a particular problem because of the capability of such compound elements to function at elevated temperatures. The customary bonding pads suitable for silicon devices has been found not to be suitable for the group III-V compounds.

Many of the problems of formation of bonding pads to group III-V compound semiconductors are set out in an article or paper entitled "A Review of the Theory and Technology for Ohmic Contacts to Group III-V Compound Semiconductors" by V. L. Rideout, published in the Solid State Electronics 1975, Volume 18 at pages 541 through 550, by Pergamon Press, printed in Great Britain. This publication sets out the background and an introduction to group III-V compound semiconductors and also points up some of the problems of the formation of Ohmic contacts for such compound semiconductors. Various prior art approaches to this problem for such compounds are also set out in this paper. These, however, have not proven entirely satisfactory for certain applications. The applicants of the present invention have devised the present invention to overcome numerous problems which have not been solved by the prior art.

The prior art approach to the formation of bonds to bonding pads to certain group III-V semiconductor compound bodies is also illustrated in the following U.S. Patents.

U.S. Pat. No. 3,214,654, issued Oct. 26, 1965 to Armstrong et al, directed to ohmic contacts to III-V semiconductive compound bodies. This patent sets forth several examples of the fabrication of ohmic contacts to semiconductor III-V compound bodies. However, he does not suggest the use of nickel chromium as the first layer of contact layer. He also does not recognize the advantage of using palladium as a metalization layer.

U.S. Pat. No. 3,406,050, issued Oct. 15, 1968 to Shortes, is directed to a method of making electrical contact to a semiconductor body. This patent discloses an approach to the formation of bonding pads for semiconductor materials, such as gallium arsenide. This patent discloses the use of high melting point refractory metals having a higher melting point than that of the wafer for attachment to the wafer. However, he does not disclose the applicant's approach to the formation of ohmic contacts.

U.S. Pat. No. 3,831,068, issued Aug. 20, 1974 to Kniepknap is directed to metal semiconductor small surface contacts. In this patent, contact for gallium arsenide semiconductor device is formed by a first layer of contact material consisting of chrome with subsequent layers of nickel, gold and silver. He does not suggest the applicant's construction.

The present invention is devised specifically for the problems of group III-V compounds and particularly for LED wafers.

SUMMARY AND OBJECTS OF THE INVENTION

It is accordingly the primary object of the present invention to overcome the above problems of the prior art.

It is another object of the present invention to provide improved bonding pad structures for III-V compounds in electrical and electronic circuits.

A still further object of the invention is to provide an improved method and bonding pad structure for LED wafers.

In accordance with the primary aspect of the present invention, a bonding pad for a group III-V compound is formed by first laying down by evaporation a first layer of nickel-chromium and a second layer which may be either palladium or gold with the top layer of the evaporation layers being palladium. Thereafter a raised pad structure is formed by plating and having a first layer portion of nickel with further portions selected from the group consisting of nickel, copper, and gold.

BRIEF DESCRIPTION OF THE DRAWING

The above and other objects and advantages of the present invention will become apparent from the following description when read in conjunction with the drawings, wherein:

FIG. 1 is an elevational view in section of a preferred pad structure.

FIG. 2 is a elevational view in section of a wafer structure prepared for the application of a bonding pad.

FIG. 3 is a view like FIG. 2 showing the first step of forming the bonding pad.

FIG. 4 is a view like FIG. 2 showing further layers of the pad structure.

FIG. 5 is a view like FIG. 1 showing an alternate embodiment of the pad structure.

DETAILED DESCRIPTION OF A PREFERRED EMBODIMENT

Turning to the drawings, particularly to FIG. 1, there is illustrated an exemplary embodiment of pad structure in accordance with the present invention. The method and apparatus of the present invention was devised primarily to provide reliable bonding pad structures for group III-V compounds, particularly that of gallium arsenide for LED wafer structures.

As best seen in FIG. 1, a wafer 12 of gallium arsenide having an insulating coating 14 of silicon dioxide or silicon nitride is provided with a contact face 16 for the connection of a bonding pad thereto. The bonding pad comprises a first layer of conducting metal 18 which consists of from 500 to 2000 angstroms of nickel-chromium. The nickel-chromium alloy layer may have varying amounts of nickel up to 80% by weight. The nickel-chromium layer 18 is laid down by vaporization in a manner well known in the industry. This layer provides a good contact system to the gallium arsenide and acts as a barrier. The next layer of the sub-pad structure consists of a layer 20 of gold of from approximately 500 to 2000 angstroms thick. This layer is likewise laid down by vaporization as in the previous layer. The gold coating or layer provides good conductivity of the pads structure.

A final or top outer coating is provided by a thin layer 22 of palladium of from 100 to up to 2000 angstroms in thickness. This final outer metalization coating is also laid down by evaporation. This coating of palladium provides for ease in subsequent layer addition by either electrolysis or electrolitic plating.

A second or raised bonding structure is then placed over the first or lower bonding structure by means of plating. This raised bonding pad comprises a first pad structure of nickel indicated by the reference numeral 24 with a upper coating of gold or the like 26. This FIG. 1 illustration sets forth an exemplary embodiment of the structure and is preferably laid down in accordance with the steps described with a thickness within the ranges specified.

The nickel-chromium layer is found to provide metalization that will adhere to the LED die and be amenable to automatic fabrication techniques.

The steps of formation of the bonding pads are illustrated in FIGS. 2 through 4 of the drawing. Taking, for example, the LED die 12 as illustrated, the surface thereof is prepared by having a suitable passivation protection layer or surface with a hole placed therein for access to a contact face as illustrated at 16. The passivation layer may be any suitable material such as silicon dioxide, or silicon nitride. This LED die or wafer is then formed with a first series of layers of metal, the first of which is nickel-chromium, and the subsequent layers may be of the materials as will be described below, but with the covering layer of palladium; all of these layers being applied by evaporation or sputtering. This provides the base or first pad structure. As illustrated in FIG. 3, up to 3 or more layers may be provided by the evaporation technique.

Thereafter, a raised bonding pad is then formed on the top of the first or lower pad structure by means of plating. The first layer of the plated portion of the illustrated embodiment is a nickel layer 24. Finally, a layer of gold is plated on the nickel for proper conductivity.

Turning to FIG. 5 of the drawing, another embodiment is illustrated wherein an LED wafer 30, similar to that of the previous embodiment, is selected having a suitable insulation layer 32 with a contact face 34. A first layer 36 of nichrome of a selected thickness is evaporated onto the LED wafer with contact properly made with the contact surface 34. Thereafter, a metalization layer of palladium 38 is applied as by evaporation. This completes the base or first portion of the structure.

Thereafter, a further raised bonding pad is provided with a first layer 40 of nickel or other suitable compound as will be described below is applied by plating. A coating of a high conductive material 42 is then layered over the nickel by plating. This second layer is selected from the group consisting for example, of copper or alloys or nickel gold, copper gold, nickel copper, or nickel copper and gold. The heart of the invention is the use of nickel-chromium as a contact system directly to the gallium arsenide and palladium as the metalization layer which allows for subsequent plating by electrolysis imersion of electrolytic for further contact construction.

By way of example, the bonding pad contacts of the present invention may be formed in a number of alternate constructions. These are set forth in the following examples.

EXAMPLE 1

The structure of the system may consist of a gallium arsenide chip of wafer on which is placed a nickel chromium content layer at the contact face followed by a gold layer and then a palladium layer. These three layers are deposited in the manner as described above, such as evaporation, and/or sputtering. Thereafter, further layers of contact metal are placed thereon which metals are selected from the group consisting of gold, nickel gold, copper, copper gold, nickel copper, or nickel copper gold. One or more contact layers of these metals are placed over the basic pad structure by means of plating or the like. This is carried out in the usual manner of forming raised bonding pads or bumps on bonding pads.

EXAMPLE 2

The wafer is prepared in the manner as described above and thereafter a series of layers of the following metals are evaporated onto the contact face of the wafer. These metals, in order, consist essentially of nickel chromium followed by a layer of palladium followed by a layer of gold. Thereafter, contact materials of nickel followed by a layer of copper and a layer of gold are plated onto the base pad structure forming the raised bonding bump or pad structure.

EXAMPLE 3

In the same method as described above, a wafer is prepared and the following metals evaporated thereon. These metals consist essentially of nickel chrome alloy followed by a layer of gold, followed by a layer of palladium, which in turn is followed by a layer of gold. These layers are laid down by evaporation or sputtering, preferably evaporation. Thereafter, a layer of copper is plated onto the pad structure forming the raised bonding pad or bump.

EXAMPLE 4

The methods as described above are used in the preparation of a wafer on which is placed a pad as follows. A first layer of nickel chrome alloy is evaporated onto the contact face followed by a layer of palladium, followed by a layer of gold. Thereafter, layers of copper followed by a layer of gold are plated onto the pad forming the raised bonding pad.

EXAMPLE 5

The pad structure of the invention is adapted to wire (leads) bonding by eliminating the raised structure in either FIGS. 1 or 5 and bonding wire leads directly to the base pad. Thus, a wire lead can be bonded directly to a pad of nickel-chrom and gold or nickel-chrome and palladium-gold.

By this method an improved pad structure is formed which is found to overcome many of the problems associated with the prior art approaches to the fabrication of pads for devices of this character. The present invention was developed and devised specifically to overcome the problems associated with the forming of bonding pads for light emitting diodes formed from gallium arsenide.

While we have illustrated and described our invention by means of specific examples and embodiments, it is to be understood that numerous changes and modifications may be made therein without departing from the spirit and scope of the invention as defined in the appended claims.

Having described our invention, we now claim:

1. A bonding pad adapted for wafers of III-V compounds comprising in combination:
   a first layer of metal contact material consisting essentially of a nickel-chromium alloy bonded to said bonding face, and
   a second layer of metal material bonded to said first bonding layer and consisting of a metal selected from the group consisting of gold and palladium.

2. The bonding pad of claim 1, comprising:
   at least a third layer consisting essentially of a metal selected from the group consisting of nickel, gold and copper.

3. The bonding pad of claim 2, wherein said first and said second layers are formed by evaporation, and said third layer is formed by plating.

4. The bonding pad of claim 1, wherein the first layer is of a thickness within the range from 500 to 2000 angstroms,
   and the second layer is of a thickness within the range from 100 to 2000 angstroms.

5. The bonding pad of claim 4, comprising at least a layer of gold having a thickness within the range from 500 to 2000 angstroms.

6. The bonding pad of claim 2, comprising a first pad structure consisting of a plurality of metal layers formed by evaporation, and
   a second pad structure consisting of at least one metal layer formed by plating a metal selected from the group consisting of nickel, gold and copper.

7. The bonding pad of claim 6, wherein said first pad structure comprises a first layer of a nickel chrome alloy, a second layer of gold, and a third layer of palladium.

8. The bonding pad of claim 7, wherein said second pad structure consists of a first layer of nickel and a second layer of gold.

9. The bonding pad of claim 7, wherein said second pad structure consists of a layer of copper.

10. The bonding pad of claim 6, wherein said first pad structure consists of:
    a first layer of nickel-chromium alloy,
    a second layer of palladium, and
    a third layer of gold.

11. The bonding pad of claim 10, wherein said second pad structure consists of:
    a first layer of nickel,
    a second layer of copper, and
    a third layer of gold.

12. The bonding pad of claim 11, wherein said second pad structure consists of:
    a first layer of copper, and
    a second layer of gold.

13. The bonding pad of claim 7, wherein:
    said layer of nickel chrome alloy has a thickness within the range of 500 to 2000 angstroms,
    said layer of gold has a thickness within the range of 500 to 2000 angstroms, and
    said layer of palladium has a thickness within the range of 100 to 2000 angstroms.

* * * * *